United States Patent [19]

Ayres et al.

[11] Patent Number: 5,684,318
[45] Date of Patent: Nov. 4, 1997

[54] ELECTRONIC DEVICES WITH THIN-FILM CIRCUIT ELEMENTS FORMING A SAMPLING CIRCUIT

[75] Inventors: John R. A. Ayres, Reigate; Martin J. Edwards, Crawley, both of England

[73] Assignee: U.S. Philips Corporation, New York, N.Y.

[21] Appl. No.: 639,277

[22] Filed: Apr. 25, 1996

Related U.S. Application Data

[63] Continuation of Ser. No. 250,082, May 27, 1994, abandoned.

[30] Foreign Application Priority Data

May 28, 1993 [GB] United Kingdom .................. 9311129

[51] Int. Cl.$^6$ .................. H01L 29/76; H01L 29/94; H01L 31/062; H01L 31/113
[52] U.S. Cl. .................................... 257/334; 257/347
[58] Field of Search ............................ 257/347, 334

[56] References Cited

U.S. PATENT DOCUMENTS

| 3,660,732 | 5/1972 | Allison | 257/347 |
|---|---|---|---|
| 4,425,631 | 1/1984 | Adam | 365/185 |
| 4,870,399 | 9/1989 | Carlson . | |
| 5,300,448 | 4/1994 | Merchant et al. | 437/41 |
| 5,313,075 | 5/1994 | Zhang et al. | 257/57 |
| 5,378,911 | 1/1995 | Murakami | 257/334 |

FOREIGN PATENT DOCUMENTS

| 0342925 | 11/1989 | European Pat. Off. . |
|---|---|---|
| 3-77915 | 4/1991 | Japan . |
| 3-77922 | 4/1991 | Japan . |

*Primary Examiner*—Stephen Meier
*Attorney, Agent, or Firm*—Steven R. Biren

[57] ABSTRACT

In an LCD or other electronic device, thin-film circuit elements on a substrate (100) form a sample-and-hold or other sampling circuit (10). The circuit (10) comprises a TFT (Ts) as a sampling transistor and preferably another TFT (T2) to compensate for displacement currents in charging and discharging the insulated gate (12) of the sampling TFT. Even when T2 is included, a slow drift in output voltage (Vo) is observed when Ts switches off, and this limits use of the circuit, especially in large area active-matrix devices. In accordance with the invention this slow drift is removed or significantly reduced by injecting minority carriers into the channel region of Ts (and T2) from a doped opposite-type region (119) or Schottky contact region (119) which is forward biased via a thin-film supply line (129). The minority carriers neutralise majority carriers which are being slowly released by thermal emission from trapping states in the TFT body.

13 Claims, 4 Drawing Sheets

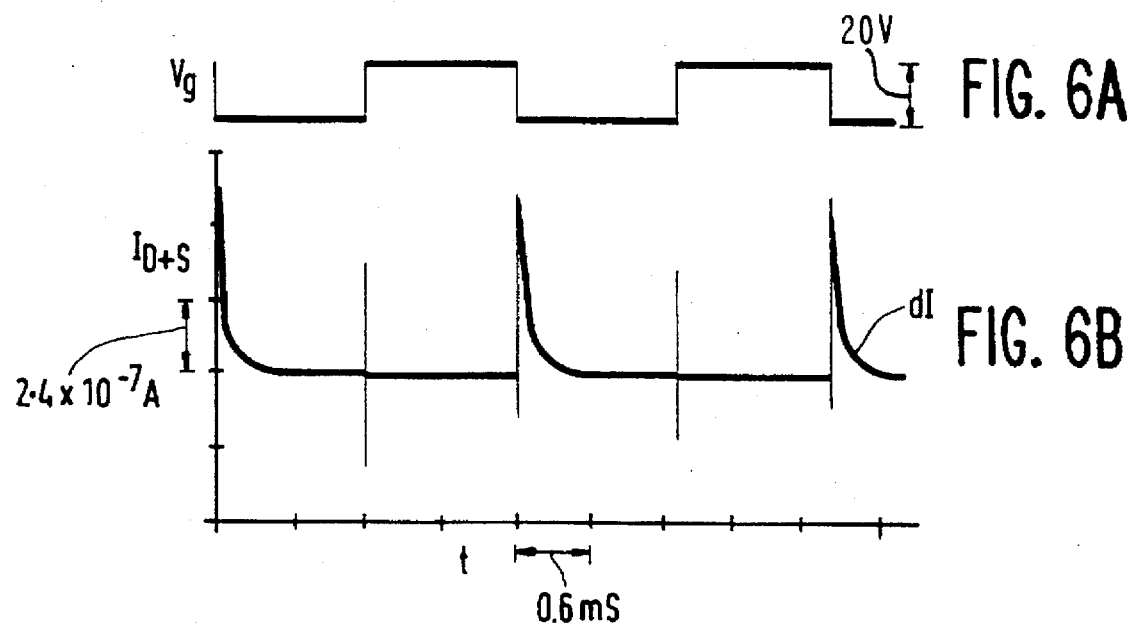
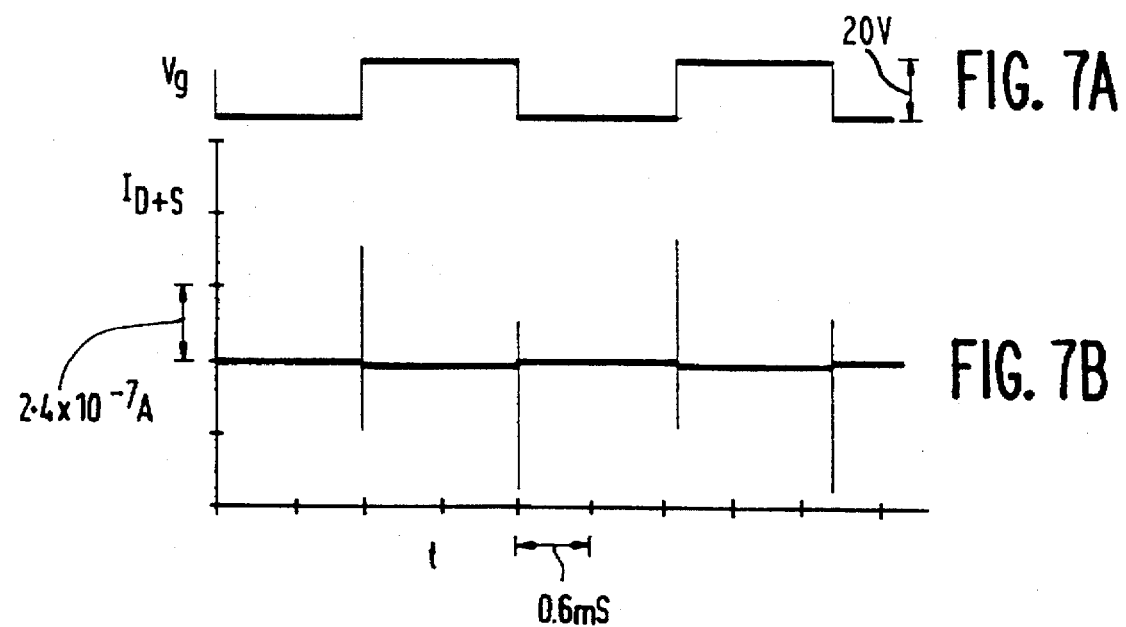

ELECTRONIC DEVICES WITH THIN-FILM CIRCUIT ELEMENTS FORMING A SAMPLING CIRCUIT

This is a continuation of application Ser. No. 08/250,082, filed May 27, 1994 now abandoned.

BACKGROUND OF THE INVENTION

This invention relates to electronic devices (for example a liquid-crystal display or other flat panel display) comprising thin-film circuit elements which form a sampling circuit, for example a sample-and-hold circuit of the device. A plurality of such sample-and-hold circuits may be integrated on the same substrate with a matrix of cells, for supplying the sampled signals as information to the cells. Thus, the circuits may form part of a column driver for an active matrix addressed liquid-crystal display. However, the present invention may be incorporated in other types of large area electronic devices, for example thin-film data stores or image sensors.

There is currently much interest in developing thin-film field-effect transistors (hereinafter termed "TFTs") on glass and other insulating substrates for large area electronics applications, for example liquid-crystal displays. Such TFTs fabricated with amorphous or polycrystalline silicon films may form switching elements of a cell matrix. A recent development involves the fabrication and integration of circuits from TFTs (often using polycrystalline silicon), for example integrated drive circuits for the matrix of a liquid-crystal display. An important circuit function in the column drive circuit of a liquid-crystal display as well as in other applications is a sample-and-hold circuit comprising a sampling transistor between an input node and a charge-storage means.

Different known examples of liquid-crystal displays having sample-and-hold circuits in their column drive circuits are disclosed, for example, in U.S. Pat. No. 4,870,399, in the English-language Patent Abstracts of Japan (Vol. 15 No. 245) and the Kokai drawings of published Japanese patent applications Kokai JP-A-03-77922 and JP-A-03-77915, and in published European patent application EP-A-0 342 925, the whole contents of which are hereby incorporated herein as background references.

In the specific embodiment of U.S. Pat. No. 4,870,399, high speed sample-and-hold circuits are made as monolithic integrated circuits in single crystal silicon material and so are separate from the display substrate. In the displays of JP-A-03-77922 and JP-A-03-77915, a sample-and-hold circuit comprising both a TFT and a signal-accumulation capacitor is provided in each of the pixel cell areas of the display. In the displays of EP-A-0 342 925, a sample-and-hold circuit comprising a TFT is provided for each of the column lines of the cell matrix, while the capacitance of the respective column line and the cells connected thereto provides the charge-storage means of the sample-and-hold circuit in the EP-A-0 342 925 examples.

Where the sampling transistor is a TFT element, the transistor has an insulated gate adjacent to a semiconductor thin-film body (for example, of polycrystalline or amorphous silicon) which accommodates a channel region of the transistor under the control of the insulated gate; the gate is connected to a thin-film control line for switching the transistor on and off so as to sample a signal from the input node and to pass the sampled signal to the charge-storage means at the output node; the passage of the signal by the transistor is by a flow of charge-carriers of a first conductivity type (electrons, in the case of an n channel TFT) which are majority charge-carriers of the channel region. Typical TFT structures are illustrated in the cross sectional views of FIGS. 3(a) and 4(d) of EP-A-0 342 925.

It is recognized in these prior art publications that a TFT element has inferior switching characteristics to a transistor formed in single crystal silicon. In particular these publications refer to a smaller ON current, a larger OFF current and a slower switching speed. These inferior characteristics are understood to result from a high density of trapping states for charge carriers in grain boundaries of the TFT structure.

One particular problem which the present inventors have observed in making sampling circuits with a TFT element is a slow drift in the output voltage at the charge-storage means. This is found to correspond to a slow decay in the output signal of the TFT sampling transistor, i.e. at the drain of the transistor connected to the charge-storage means. The effect is sufficiently large to limit the use of sample-and-hold circuits fabricated from TFTs in large-area electronics devices. In particular the inventors have found difficulty in designing a satisfactory TFT sample-and-hold circuit as part of a drive circuit for individual column lines of a large-area cell matrix, for example a liquid-crystal display. As a result of the drift, the signal being held by each charge-storage means differs from the input signal sampled by the TFT. Furthermore this error in the signal varies with time so that the magnitude of the error can be significantly different for points in a cell matrix which are read after very different storage times, for example at the beginning and end of a row of a large matrix.

The slow decay in the output signal of a TFT sampling transistor is problematic not only in sample-and-hold circuits but also in other types of sampling circuit. Thus, for example when the output of the TFT is used as a current (instead of stored charge), there is a slow drift in the output current when the TFT sampling transistor is switched off.

SUMMARY OF THE INVENTION

It is an aim of the present invention to overcome or at least to reduce significantly this drift problem in the output of sampling circuits comprising TFT sampling transistors. According to the present invention in an electronic device comprising on a substrate a pattern of thin-film circuit elements which form a sampling circuit of the device, the circuit comprising a sampling transistor between an input node and an output node, the sampling transistor is a thin-film field-effect transistor element having an insulated gate adjacent to a semiconductor thin-film body which accommodates a channel region of the transistor under the control of the insulated gate, the gate being connected to a thin-film control line for switching the transistor on and off so as to sample a signal from the input node and to pass the sampled signal to the output node, the passage of the signal by the transistor being by a flow of charge-carriers of a first conductivity type which are majority charge-carriers of the channel region, which device is characterized in accordance with the invention by the sampling transistor comprising a minority charge-carrier injector region in the vicinity of the channel region, which injector region is connected to a thin-film supply line for forward-biasing the injector region with respect to the channel region and so providing a supply of charge-carriers of a second conductivity type opposite to the first type for injection as minority charge-carriers into the channel region during the switching off of the transistor.

The present inventors have discovered that such provision of minority carrier injection in the vicinity of the channel region can significantly reduce and even completely remove the slow output drift of the TFT sampling circuit. This discovery is based on an experimental investigation by the present inventors of the slow drift phenomenon which led to an understanding that the time dependence of the drift is due to the slow thermal emission of electrons in the case of n channel TFTs (or holes in the case of p channel TFTs) from trapping states deep in the semiconductor band-gap of the semiconductor thin-film body of the sampling transistor. This slow transient is removed in accordance with the present invention by injecting holes in the case of an n-channel TFT (or electrons in the case of a p channel TFT) into the body of the sampling transistor to neutralise the trapped charge when the transistor is being switched off. Particular characteristics are illustrated later by reference to the experimental results of FIGS. 5 to 7.

An injector region and its connection in accordance with the present invention may be integrated with quite different types of TFT structure, both conventional types and new types. Schottky junctions are sometimes used in thin-film technology, and the injector region in accordance with the present invention may be formed by a metal-based film forming a Schottky junction with the semiconductor thin-film body of the transistor. However, it is more common at present in thin-film technology to form p-n Junctions, by using doped semiconductor regions which are deposited on or before the semiconductor thin-film body or which alternatively are implanted or diffused into the semiconductor thin-film body. Thus the sampling transistor may be formed with semiconductor source and drain regions of the first conductivity type which are coupled to the input and output nodes respectively, and the injector region may be a semiconductor region of the second conductivity type. This injector region (and even a part of its connection) may be formed by doping a region of the semiconductor thin-film body of the transistor with conductivity type determining dopant characteristic of the second conductivity type (for example by localized dopant implantation), or it may be formed by a separately deposited film of the second conductivity type. Depending on the particular thin-film technology employed, the semiconductor thin-film body itself may be a high resistivity material of the first conductivity type or of the second conductivity type. Usually there is no deliberate conductivity type doping of the transistor thin-film body. Because of the high density of trapping states in the material, the semiconductor thin-film body generally has intrinsic conductivity. The conduction channel region of the first conductivity type is produced in this semiconductor material adjacent the insulated gate, at least during the ON state of the TFT under the control of the insulated gate. The semiconductor thin-film body is usually of high mobility polycrystalline silicon for drive circuits of a cell matrix such as a liquid-crystal display. However other semiconductor materials such as for example hydrogenated amorphous silicon or polycrystalline Group II–VI compound semiconductors may be used for the transistors in some cases, and these transistors may be provided with an injector region and its connection in accordance with the present invention.

As well as these variations in the type of thin-film technology employed, the invention may be incorporated in quite different TFT configurations. In the most commonly required sampling circuits, the sampling transistor will have a single insulated gate, but this gate itself may be split into different parts. Furthermore, in some circuits for example, the sampling TFT may have one or more insulated gates. The region of the semiconductor thin film which accommodates the channel region may be sandwiched between the substrate and an (or the) insulated gate. In this case, the sampling TFT may be of the so-called "staggered" type or of the so-called "co-planar" type. Particular examples are described later with the incorporation of the injector region and its connection in various ways in accordance with the invention. Thus, for example, the injector region and its connection may protrude to at least one side of the channel region or may be located over at least one of the source and drain regions. An (or the) insulated gate may be sandwiched between the semiconductor thin-film body and the substrate. In this case the sampling TFT may be of the so-called "inverted staggered" type, a particular example of which will also be described later. The injector region may be located, for example, over the channel region in this case.

A sampling transistor having an injector region in accordance with the present invention may be used in a sampling circuit having a current as an output. Such a circuit may form part of, for example, a current mirror. However, the invention is particularly advantageous in removing or at least significantly reducing output voltage drift in sample-and-hold circuits which have a charge-storage means coupled to the output node of the sampling transistor.

In order to remove the effects of displacement-current pulses when the gate capacitance of the sampling transistor is charged and discharged, it is advantageous for the sampling circuit to comprise a second TFT whose gate charging and discharging characteristics are the same as the sampling TFT, the second transistor being switched on when the sampling transistor is switched off and vice versa. A similar injector region may be incorporated in this second TFT so that it has the same switching characteristics as the sampling TFT.

BRIEF DESCRIPTION OF THE DRAWING

These and other features in accordance with the invention are illustrated in embodiments of the present invention now to be described, by way of example, with reference to the accompanying drawings, in which:

FIGS. 6 and 7 are tracings of oscilloscope plots of the variation of current $I_{D+S}$ (on a scale of $2.4 \times 10^{-7}$ amps per scale division) against time t (on a scale of 0.6 ms per scale division) when gate voltage pulses Vg are applied to turn the sampling TFT on and off; FIG. 6 is for the situation without minority carrier injection, while FIG. 7 is for the situation where minority carrier injection is employed in accordance with the present invention.

Figure 5:
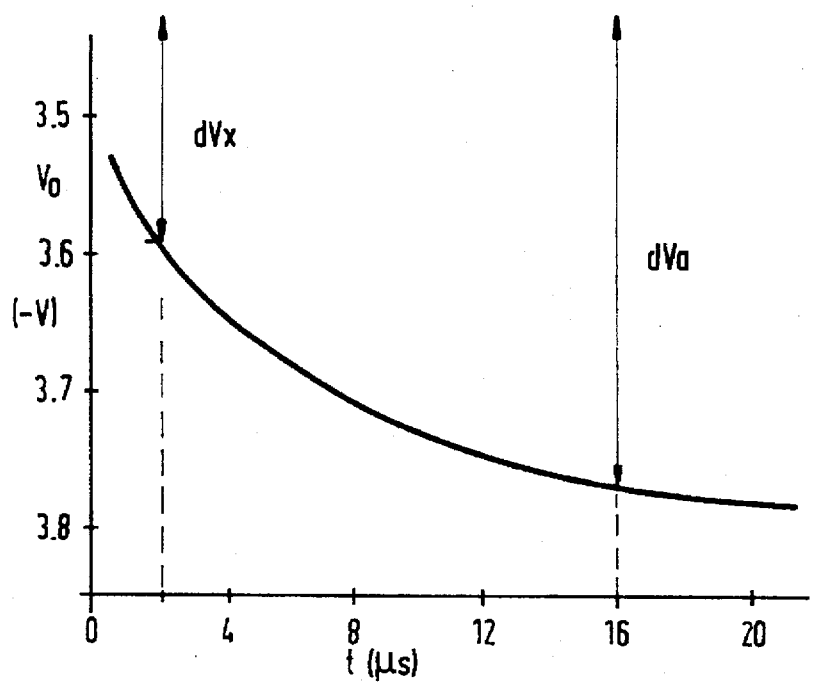
FIG. 5 is a plot of the sampled output voltage Vo (in volts) against time t (in µs) for a circuit comprising a TFT sampling transistor which does not include minority carrier injection in accordance with the present invention.

It should be noted that, except for the plots of FIGS. 5 to 7, all the drawings are diagrammatic and not drawn to scale. Relative dimensions and proportions of parts of FIGS. 1,3,4,8 and 9 have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

Figure 1:
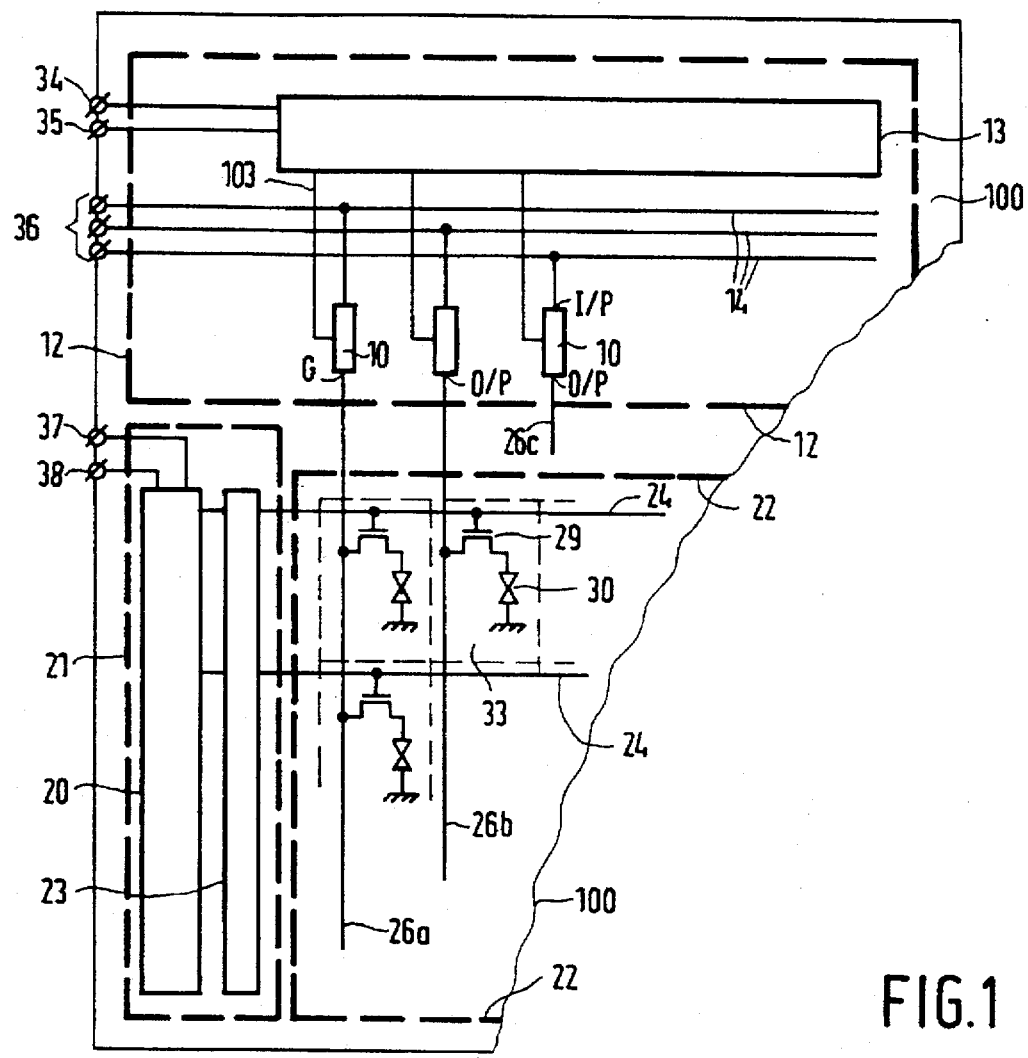
FIG. 1 is a circuit block diagram of an example of an electronic device in accordance with the present invention, and the circuitry of which includes a plurality of sample-and-hold circuits.
Figure 2:
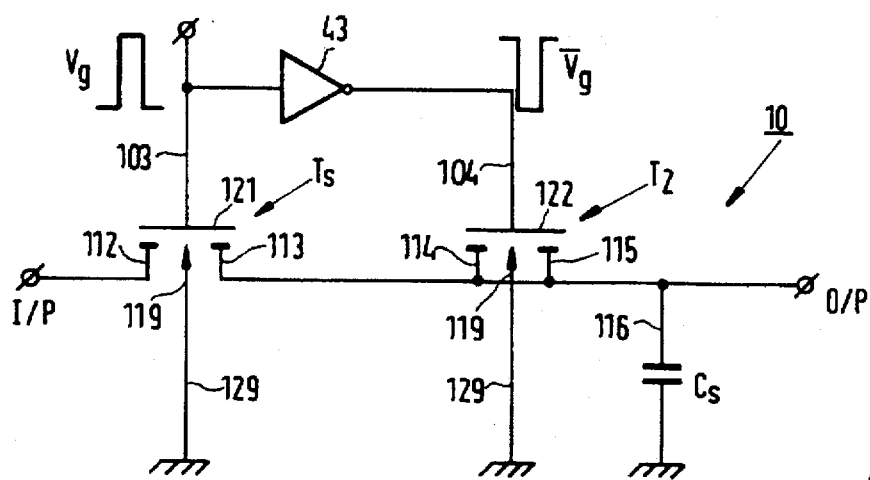
FIG. 2 is a circuit diagram of an example of such a sample-and-hold circuit formed in accordance with the present invention.
Figures 3, 4:
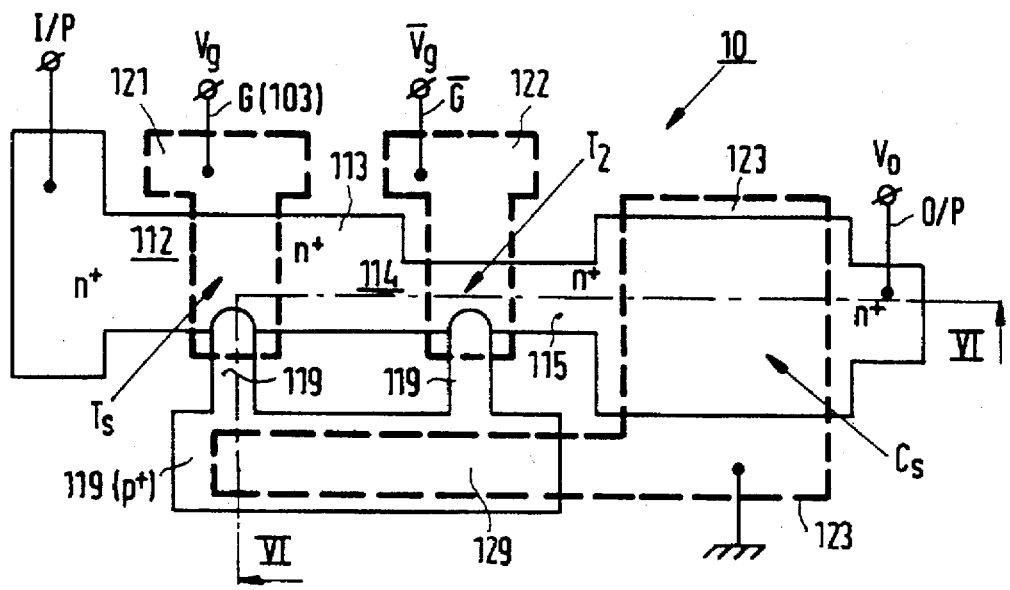
FIG. 3 is a schematic plan view of part of the thin-film circuit element pattern of an example of the circuit of FIG. 2.
FIG. 4 is a cross-sectional view on the line IV—IV of FIG. 3 of part of an example of the circuit element pattern of FIG. 3.

Apart from the formation of its sampling circuits 10 in accordance with the present invention, the electronic device of FIG. 1 may be of known type and known construction. The device comprises a matrix 22 of cells 33 (particularly but not exclusively for a liquid-crystal display) organized in rows and columns on an insulating substrate 100, for example a glass back panel of the display. The matrix 22 has thin-film row lines 24 connected to a row drive circuit 21 for addressing rows of the matrix 22. The matrix 22 also has thin-film column lines 26 connected to a column drive circuit 12 for supplying sampled signals to cells 33 in the addressed row. These lines 24 and 26 and drive circuits 12 and 21 are integrated in thin-film technology on the same substrate 100 as the matrix 22. The drive circuit 12 for the column lines 26 comprises a shift register 13 which addresses sequentially individual sample-and-hold circuits 10 for each column line 26. The present invention permits the provision of a high performance individual sample-and-hold circuit 10 for each column line 26, with an individual TFT sampling transistor Ts (see FIGS. 2,3 and 4) for each column line 26. Depending on the capacitance of the column line 26, each circuit 10 may include a discrete storage capacitor $C_s$ (as illustrated in FIGS. 2,3 and 4) or the capacitance of the line 26 itself may provide the charge-storage means of the sample-and-hold circuit 10.

Apart from the circuits 10 formed in accordance with the invention, the device of FIG. 1 may be similar to the active matrix display panel of FIG. 1 of EP-A-0 342 925 as a particular example. Thus, the present FIG. 1 is based on FIG. 1 of EP-A-0 342 925, and the features for which the same reference signs are used as in FIG. 1 of EP-A-0 342 925 may be the same as or similar to those of EP-A-0 342 925. This display panel embodiment of the device of FIG. 1 will therefore not be described further. Although the switching elements 29 in the individual cells 33 of EP-A-0 342 925 are TFTs, it should be understood that other types of switching element 29 may be used in such a display, for example thin-film diodes as described in European patent application EP-A-0 561 462 published on 22nd Sep. 1993. The circuit blocks 13,20 and 23 may be formed with complementary p channel and n channel TFTs, or they may be formed entirely with n channel TFTs. Instead of being a flat panel display, the matrix device of FIG. 1 may be designed for a quite different function, for example a data store having a matrix of thin-film switching elements 29 for addressing an array of thin-film data storage elements (for example thin-film capacitors).

The sample-and-hold circuits 10 are connected between signal lines 14 and the column lines 26, and they supply the sampled signals as information to the cells 33. Each circuit 10 has an input node I/P from a signal line 14, a control node G from the shift register 13, and an output node O/P to a column line 26. An example of the circuit configuration of each circuit 10 is shown in FIG. 2. A sampling thin-film transistor Ts is connected between the input node I/P and a charge-storage means $C_s$, for example a thin-film capacitor.

The output O/P is taken from the charge-storage element $C_s$. As illustrated in the example of FIGS. 3 and 4, the sampling TFT Ts has an insulated gate 121 adjacent to a semiconductor thin-film body 110 which accommodates a conduction channel region 111 of the transistor Ts. The gate 121 is connected to a thin-film control line 103 from the shift register 13 for switching the transistor Ts on and off so as to sample a signal from the input node I/P and to pass the sampled signal to the charge-storage element $C_s$. The output node O/P of the circuit 10 is connected to the charge-storage element $C_s$.

In a typical column drive circuit 12 for a flat panel display, the semiconductor film 110 providing the body of the transistor Ts is of high-mobility polycrystalline silicon. The film 110 is usually of intrinsic conductivity (I), although it may have a low p type or n type conductivity. The passage of the signal by the transistor Ts under the control of the insulated gate 121 is by a flow of charge-carriers of a first conductivity type which are majority charge-carriers of the channel region 111. By way of example FIGS. 3 and 4 illustrate an n channel TFT, in which the carrier flow is by electrons between an n type source region 112 and an n type drain region 113. The transistor Ts is switched on by a positive gate voltage pulse Vg. The pulse Vg induces an n type conduction channel in the undoped body region 111 which is between the source and drain regions 112 and 113 and under the insulated gate 121. When the gate voltage Vg falls to zero or goes negative, no conduction channel is present between the source and drain regions 112 and 113. However there is a high density of trapping states in the polycrystalline silicon material of the film 110. The inventors have found that electrons (in an n channel device) which were trapped in trapping states deep in the semiconductor band-gap during the ON state of the transistor Ts are slowly released from these trapping states when the transistor Ts is switched into the OFF state. In the absence of hole injection in accordance with the present invention, the release of the trapped electrons is by a slow thermal emission which results in a slow decay dI of the drain current as illustrated in FIG. 6 and hence a slow drift of the output voltage Vo as illustrated in FIG. 5. The inventors find that the slow drift has a characteristic logarithmic time dependence. This slow drift of the output voltage Vo introduces errors into the signal applied to the cells 33.

Firstly, there is an error in the absolute value of the sampled signal Vo on each column. Because Vo varies with time, the voltage as applied to a cell 33 on any one particular column line 26 differs from that which was sampled at the input I/P for that column line 26. Secondly, there is an error between the signals on different column lines 26 for cells 33 addressed in any one particular row. All the cells 33 of one row 24 are addressed at the same time, and yet the signals Vo for the cells 33 of that row 24 have been sampled by their circuits 10 at different times, and so these sampled signals have been held by their circuits 10 for different lengths of time. Thus, for example in FIG. 5, dVa indicates the error in Vo for a column line 26a which is addressed by the row line 24 at a time t corresponding to 16 μs after its signal was first stored in $C_s$ by switching off its Ts. The cell 33 on a column line 26x further along the row 24 is addressed in a much shorter time (2 μs in FIG. 5) after its signal Vo was first stored. Assuming that the same level of signal Vo was sampled for both the lines 26a and 26x, then the signal drift for both the lines 26a and 26x is represented by the same plot as in FIG. 5, and the difference between dVa and dVx in FIG. 5 illustrates the error occurring between the column lines 26a, . . . 26x, along a row 24 of the matrix 22.

There is another effect on the drain output signal of the sampling transistor Ts due to the displacement current which results when the capacitance of the insulated gate 121 is discharged. This capacitance discharge produces a large initial current spike due to the free electrons being driven rapidly out of the channel. This effect is compensated in the circuit of FIG. 2 by including in the sample-and-hold circuit 10 a second transistor T2 whose gate charging and discharging characteristics when switching ON and OFF are substantially the same as those of the sampling transistor Ts. This second transistor T2 has source and drain regions 114 and 115 connected together and in series between the charge-storage means $C_s$ and the output node 113 of the sampling transistor Ts. The gate 122 of this second transistor is connected to a thin-film control line 104 supplying a control signal $\overline{T}g$ which is complementary to that (Vg) supplied to the gate 121 of the sampling transistor Ts and slightly delayed as compared with Vg. This delayed complementary signal $\overline{V}g$ may be fed on the line 104 direct from the shift register 13. Alternatively, as illustrated in FIG. 2, the signal Vg on line 103 from the shift register may be fed to both the sampling transistor Ts and to a TFT inverter 43 in the circuit 10, and the output of the inverter 43 may be fed on line 104 to the second transistor T2. The transistor T2 thus compensates for the effects due to the displacement current pulses which result when the gate capacitance of the sampling transistors Ts is charged or discharged. The charge from these very rapid displacement current pulses would otherwise produce an error in the sampled voltage measured across the capacitor element $C_s$. However this compensating transistor T2 cannot eliminate the slow logarithmic drift of the output voltage which occurs only when switching off the transistor Ts and which is due to emission of trapped electrons from the trapping states.

This slow logarithmic drift is eliminated or at least considerably reduced in accordance with the present invention by providing a minority charge-carrier injector region 119 in the vicinity of the channel region 111 of the sampling transistor Ts. In the case of the n channel transistor Ts illustrated in FIGS. 3 and 4, the injector region 119 is p type so as to inject holes. This injector region 119 is connected to a thin-film supply line 129 for forward-biasing the injector region 119 with respect to the channel region 111 and so providing a supply of holes (in the example of FIGS. 3 and 4) as minority carriers into the channel region 111 during the switching off of the transistor Ts. This is most easily achieved by connecting the injector region 119 to ground potential as illustrated in FIGS. 2 and 4. The resulting suppression of the slow logarithmic drift can be seen by comparing FIG. 7 with FIG. 6.

In order to obtain the experimental results of FIGS. 6 and 7, the source and drain regions 112 and 113 of a single separate sampling transistor Ts were shorted together (similar to the transistor T2) and connected to a current measuring circuit. The current from this drain and source connection is designated as $I_{D+S}$. This same single transistor structure was used for both the measurements and was switched off and on with a gate pulse Vg of 20 volts. In the case of FIG. 6 the injector region 119 was left at floating potential, i.e. without the line 129 connected to ground or to any other potential; in this case no hole injection can occur and the slow decay dI in output signal is observed when the transistor Ts is switched off. In the case of FIG. 7, the injector region 119 was connected to ground potential by the line 129, hole injection occurs from the p type region 119 into the channel region 111 and results in such a rapid neutralisation of the trapped electron charge that the slow decay effect seems to be completely eliminated. In the plot of FIG. 7, the rapid displacement current pulses remain due to the charging/discharging of the gate capacitance of the single transistor Ts. However in the sampling circuit of FIG. 2, these displacement current effects are removed at the capacitor Cs by the second transistor T2.

FIG. 3 shows one example of how the circuit 10 of FIG. 2 may be integrated in thin-film technology on the substrate 100. The circuit elements Ts, T2 and $C_s$ may be formed in and on integral parts of a common thin-film body 110 which is shown in thick outline. In this example, the drain 113 of Ts and source 114 of T2 are formed by a common n+ region 113,114, and the drain 115 of T2 is formed by a side-ways protruding part 115 of the n+ bottom region 116 of the capacitor $C_s$. A doped region 119 of the second conductivity type protrudes to one side of the channel region 111 of transistor Ts to form the injector region for Ts and at least a part of its connection to the supply line 129. It is preferable to separate the p+ injector region 119 from the n+ source and drain regions 112 and 113 by a part of the intrinsic or high resistivity material of the body 110, in order to reduce leakage currents. Because the displacement currents of Ts flow half towards the source 112 and half towards the drain 113, the channel of the compensating transistor T2 is half the area of the channel 111 of the sampling transistor Ts. In FIG. 3 Ts and T2 have the same channel length, and this half-area is achieved by making the channel width of T2 half the channel width of Ts. Otherwise, the compensating transistor T2 is of substantially the same transistor geometry as Ts. In the example of FIG. 3 this second transistor T2 also includes a minority carrier injector region 119 (with connection 129) for injecting minority charge-carriers into the channel region of T2 during the switching off of T2 when Ts is being switched on. Thus, in this case, T2 is wholly equivalent to Ts as regards its switching characteristics. The injector regions 119 of both Ts and T2 may form part of a common p+ region at one side of the transistors as illustrated in FIG. 3. Broken outlines are used in FIG. 3 to indicate the gates 121 and 122 of Ts and T2 and the second plate 123 of the capacitor $C_s$. These conductive regions 121,122 and 123 may be formed from a common film, for example of doped polycrystalline silicon. This second plate 123 of $C_s$ is connected to ground potential, and (as illustrated in the example of FIG. 3) it may have an extension which forms part of the ground line 129 connected to the p+ injector region 119.

FIG. 4 illustrates one example of the vertical construction of the thin-film patterns of FIG. 3 using coplanar TFT technology. In this case the semiconductor thin-film body 110 of the transistors is deposited on the substrate 100, and the insulated gates 121, 122 and insulated second plate of $C_s$ are deposited on the upper surface of the body 110. The regions 112,113,114,115,116 and 119 are formed as doped regions of the body 110. The p+ injector regions 119 and n+ capacitor region 116 may be formed before depositing the dielectric and conductive films for the insulated gates. The n+ source and drain regions 112,113,114,115 are formed after providing the gates 121,122 and capacitor plate 123, for example by dopant ion implantation. In a specific example, the thin-film body 110 may be of undoped polycrystalline silicon with intrinsic conductivity and with a thickness in the range of 0.02 µm to 0.3 µm, for example 0.1 µm; the source and drain regions 112 to 115 may be doped with arsenic or phosphorus in the range of, for example, $10^{18}$ to $10^{20}$ cm$^{-3}$; the injector regions 119 may be boron doped to a concentration in the range of, for example, $10^{18}$ to $10^{20}$ cm$^{-3}$, and regions 119 may be spaced by a distance in the range of, for example, 1 to 10 µm from the source and drain regions; the channel length (i.e. the width of the gate 121,122) between source and drain regions may be in the range of 5 to 20 µm, whereas the width of the channel 111 (i.e. gate length) of Ts may be in the range of 10 to 500 µm depending on the capacitance value of $C_s$ and the required rate of charging $C_s$. Suppression of the voltage decay dV in the output voltage Vo by minority carrier injection in accordance with the invention permits the use of larger area sampling transistors Ts for faster charging of a given $C_s$.

In FIG. 4, no reference signs are given to the dielectric films between the semiconductor body 110 and the electrodes 121, 122 and 123. These dielectric films may be silicon nitride and/or silicon dioxide and may have a thickness in the range of 0.05 to 0.5 µm, at least for the insulated gates 121 and 122. It may be desirable to form the dielectric and upper plate 123 of capacitor $C_s$ in different technology and process steps from the insulated gates 121 and 122, depending on desired capacitance values and convenience in manufacture. Thus, at least part of the capacitor dielectric may be a later deposited insulating film, and the upper plate 123 may be formed from the same conductive film as provides source and drain metallization (references 133 and 135 in FIG. 4) for Ts and T2. Instead of doping part of the body 110, the bottom plate of the capacitor $C_s$ may be formed conveniently from the same film as provides the gates 121 and 122 and be separated by a further insulating film from the upper plate 123 which may be formed simultaneously with the source and drain metallization 133,135. This modification avoids an n type doping step (for the bottom plate 116) before the source and drain doping for regions 112 to 115.

FIGS. 3 and 4 illustrate the p type injector region 119 extending beneath the insulated gates 121 and 122, which requires a separately masked p type doping step before providing the insulated gates 121 and 122. However, the injector regions 119 may be formed by boron implantation after providing the insulated gates 121 and 122; in this case the edge of the injector region 119 nearest the transistor channel may be aligned with the edge of the gate 121, 122 by using the insulated gates 121 and 122 as part of the implantation mask for the boron implant.

Figure 8:
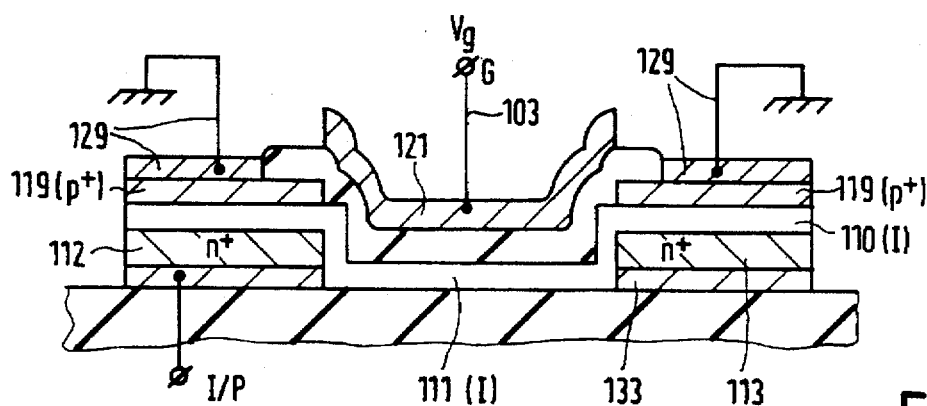
FIGS. 8 and 9 are cross-sectional views of other sampling TFTs with minority carrier injection in accordance with the present invention.
Figure 9:
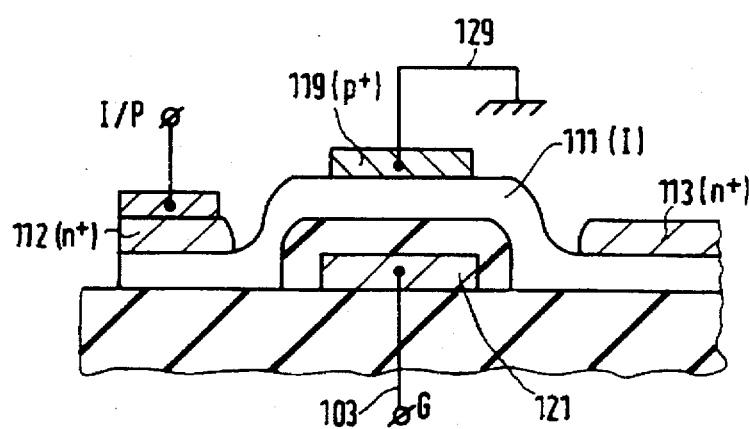

It will be evident from what is described above that the present invention may also be used with quite different TFT technologies. Two such examples are illustrated in FIGS. 8 and 9 in respect of the construction of the sampling transistor Ts. It should be understood that the same thin-film technologies as used to form Ts in FIGS. 8 and 9 may be used to form the other thin-film circuit elements T2 and $C_s$ and their connections in the FIG. 2 circuit.

FIG. 8 illustrates the inclusion of the p+ injector region 119 and its ground connection 129 in a so-called "staggered" TFT configuration. In this example the source and drain regions 112 and 113 are formed in an n+ thin film on the substrate 100, then the semiconductor film 110 for the transistor body is deposited, then the injector region(s) is formed by a p+ further film deposited on the film 110, and finally the insulated gate 121 and connection lines 129 are formed by further films. Thus, in the example of FIG. 8 the injector region 119 is a doped region of the second conductivity type which is located adjacent to the upper surface of the semiconductor thin-film body 110 and over the source and drain regions 112 and 113 of Ts. FIG. 8 shows the p+ injector region 119 over both the source and drain regions, but the region 119 may be located over only the source region 112 or over only the drain region 113 if so desired.

FIG. 9 illustrates the inclusion of the p+ injector region 119 and its ground connection 129 in a so-called "inverted staggered" TFT configuration. In this example the insulated gate 121 is sandwiched between the substrate 100 and the semiconductor thin-film body 110. The injector region 119 is a doped region of the second conductivity type which is located adjacent to the upper surface of the semiconductor thin-film body 110 and over at least a part of the channel region 111. The p+ region 119 may be formed from a separately deposited film on the thin-film body 110 of Ts, or it may be formed by dopant implantation into the upper surface of the body 110.

As mentioned above, the capacitance of the respective column line 26 may be used to provide the entire charge-storage means for the sample-and-hold circuit 10. In this case a separate distinct capacitor $C_s$ is not provided.

FIG. 3 illustrates the connection 129 for the injector region 119 as an extension of one plate 123 of the capacitor $C_s$. However, the connection 129 may be completely separate from the capacitor $C_s$, and different potentials may be applied to the injector region 119 and to the capacitor $C_s$ (if any such capacitor is present). Thus, for example, when sampling negative voltages at the input node I/P, the injector region 119 may be connected (via 129) to a negative potential. This negative potential applied to the region 119 is less than that of the channel region 111 and of the signal being sampled, and so the injector region 119 is still forward-biased with respect to the channel region 111 when the transistor is switched off.

The present invention is especially beneficial for sampling analog signals as information for column lines 26 of a matrix. However, sampling transistors with minority-carrier injector regions 119 (and connections 129) may be used with digital signal levels, for example in a row driver buffer circuit 23 of FIG. 1 which provides an output on the row lines 24 for addressing the cells 33.

As mentioned above the active matrix device may be a flat-panel display or for example a data store. However, the active matrix device may be image sensor having a matrix 22 of cells 33 each comprising a thin-film image-sensing element (for example a photodiode) addressed by a thin-film switching element 29 via row lines 24; in this case, the photodiode signal may be output to sensing circuitry 13 via a sample-and-hold circuit 10 which acts as an integrator for the signal. Such a circuit 10 for an image sensor may be constructed in accordance with the present invention with a TFT sampling transistor Ts having a forward-biased injector region 119.

From reading the present disclosure, other variations and modifications will be apparent to persons skilled in the art. Such variations and modifications may involve equivalents and other features which are already known in thin-film technologies and in the design, manufacture and use of sample-and-hold circuits and of drive circuits for active matrix devices and component parts thereof, and which may be used instead of or in addition to features already described herein.

We claim:

1. An electronic device comprising a pattern of thin-film circuit elements on a substrate which form a sampling circuit of the device, the circuit comprising a sampling transistor between an input node and an output node, said sampling transistor being a thin-film field-effect transistor element having an insulated gate adjacent to a semiconductor thin-film body which is deposited on the substrate and comprises a channel region of the transistor controlled by the insulated gate, the gate being connected to a thin-film control line for switching the transistor on and off so as to sample a signal from the input node and to pass the sampled signal to the output node, the passage of the signal by the transistor in an on state being effected by a flow of charge carriers of a first conductivity type which are majority charge carriers of the channel region, the channel region having a density of trapping states which trap charge carriers of the first conductivity type in the on state of the transistor, and which release the trapped charge carriers of the first conductivity type by thermal emission when the transistor is switched into an off state, the sampling transistor comprising a minority charge carrier injector region which is adjacent the channel region and is connected to a thin-film supply line for forward biasing the injector region with respect to the channel region to provide a supply of charge carriers of a second conductivity type opposite to the first type for injection as minority charge carriers into the channel region during switching off of the transistor, which minority charge carriers neutralize within the channel region the charge carriers of the first conductivity type released by thermal emission.

2. A device as claimed in claim 1, wherein the sampling transistor comprises semiconductor source and drain regions of the first conductivity type which are coupled to the input and output nodes respectively, and the injector region is a semiconductor region of the second conductivity type.

3. A device as claimed in claim 2, wherein the semiconductor thin-film which provides the body of the sampling transistor has a region which is doped with conductivity type determining dopant characteristic of the second conductivity type to form the injector region of the second conductivity type.

4. A device as claimed in claim 2, wherein the region of the semiconductor thin film which comprises the channel region is sandwiched between the substrate and the insulated gate.

5. A device as claimed in claim 3, wherein a doped region of the second conductivity type protrudes to one side of the channel region to form both the injector region and at least a part of its connection to the supply line.

6. A device as claimed in claim 4, wherein the injector region is a doped region of the second conductivity type which is located adjacent to the upper surface of the semiconductor thin-film body and over at least one of the source and drain regions of the transistor.

7. A device as claimed in claim 3, wherein the insulated gate is sandwiched between the substrate and the semiconductor thin-film body, and the injector region is a doped region of the second conductivity type which is located adjacent to the upper surface of the semiconductor thin-film body and over at least a part of the channel region.

8. A device as claimed in claim 1 the sampling circuit is a sample-and-hold circuit comprising a charge-storage means coupled to the output node of the sampling transistor.

9. A device as claimed in claim 8, wherein the sample-and-hold circuit comprises a second thin-film field effect transistor whose gate charging and discharging characteristics when switching on and off are substantially the same as those of the sampling transistor, the second transistor has source and drain regions connected together and in series between the charge-storage means and the output node of the sampling transistor, and the gate of the second transistor is connected to a thin-film control line supplying a control signal complementary to that supplied to the gate of the sampling transistor.

10. A device as claimed in claim 9, wherein the second transistor includes a minority charge-carrier injector region for injecting minority charge-carriers into the channel region of the second transistor during the switching off of the second transistor when the sampling transistor is being switched on.

11. A device as claimed in claim 8, further comprising a plurality of the sample-and-hold circuits integrated on the same substrate with a plurality of cells, and in that the sample-and-hold circuits supply their sampled signals as information to the cells.

12. A device as claimed in claim 11, wherein the cells are organized in a matrix which has thin-film row lines for addressing rows of the matrix and has thin-film column lines for supplying the sampled signals to cells in the addressed row, and a drive circuit for the column lines comprises an individual one of the sample-and-hold circuits for each column line.

13. A device as claimed in claim 1, wherein the injector region of the sampling transistor is connected to ground potential by the thin-film supply line.

* * * * *